United States Patent
Furukawa et al.

(10) Patent No.: US 6,333,245 B1
(45) Date of Patent: Dec. 25, 2001

(54) METHOD FOR INTRODUCING DOPANTS INTO SEMICONDUCTOR DEVICES USING A GERMANIUM OXIDE SACRIFICIAL LAYER

(75) Inventors: Toshiharu Furukawa, Essex Junction; Mark C. Hakey, Fairfax; Steven J. Holmes, Milton; David V. Horak, Essex Junction, all of VT (US); William H. Ma, Fishkill, NY (US); Donald W. Rakowski, Milton, VT (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/469,137

(22) Filed: Dec. 21, 1999

(51) Int. Cl.[7] .................................................. H01L 21/22
(52) U.S. Cl. ............................................................. 438/542
(58) Field of Search .................................... 438/488, 491, 438/542, 548, 558, 563, 564

(56) References Cited

U.S. PATENT DOCUMENTS

| | | | |
|---|---|---|---|
| 3,001,896 | * 9/1961 | Marinace et al. | 438/563 |
| 3,767,484 | 10/1973 | Takagi et al. | 438/301 |
| 3,798,081 | 3/1974 | Beyer | 438/560 |
| 3,856,588 | 12/1974 | Hashimoto et al. | 438/559 |
| 3,886,005 | 5/1975 | Cota et al. | 438/559 |
| 3,997,351 | 12/1976 | Vergano et al. | 501/9 |
| 4,072,545 | 2/1978 | De La Moneda | 438/294 |
| 4,076,559 | 2/1978 | Chang et al. | 438/538 |
| 4,102,715 | 7/1978 | Kambara et al. | 438/549 |
| 4,191,595 | 3/1980 | Aomura et al. | 438/345 |
| 4,313,773 | 2/1982 | Briska et al. | 438/560 |
| 5,358,890 | 10/1994 | Sivan et al. | 438/450 |
| 5,550,082 | 8/1996 | Wolfe et al. | 438/567 |
| 5,569,624 | 10/1996 | Weiner | 438/285 |
| 5,656,541 | 8/1997 | Rapp et al. | 438/563 |
| 5,770,490 | 6/1998 | Frenette et al. | 438/199 |
| 5,824,584 | 10/1998 | Chen et al. | 438/267 |
| 5,851,909 | 12/1998 | Kamiya et al. | 438/567 |

FOREIGN PATENT DOCUMENTS

50007478 A * 1/1975 (JP).
8-213605 8/1996 (JP).

* cited by examiner

Primary Examiner—Keith Christianson
(74) Attorney, Agent, or Firm—Schmeiser, Olsen & Watts; William D. Sabo

(57) ABSTRACT

A method for introducing dopants into a semiconductor device using doped germanium oxide is disclosed. The method includes using rapid thermal anneal (RTA) or furnace anneal to diffuse dopants into a substrate from a doped germanium oxide sacrificial layer on the semiconductor substrate. After annealing to diffuse the dopants into the substrate, the germanium oxide sacrificial layers is removed using water thereby avoiding removal of silicon dioxide ($SiO_2$) in the gates or in standard device isolation structures, that may lead to device failure. N+ and p+ sources and drains can be formed in appropriate wells in a semiconductor substrate, using a singular anneal and without the need to define more than one region of the first doped sacrificial layer. Alternatively, annealing before introducing a second dopant into the germanium oxide sacrificial layer give slower diffusing ions such as arsenic a head start.

26 Claims, 25 Drawing Sheets

METHOD FOR INTRODUCING DOPANTS INTO SEMICONDUCTOR DEVICES USING A GERMANIUM OXIDE SACRIFICIAL LAYER

BACKGROUND OF THE INVENTION

1. Technical Field

This invention generally describes a method for introducing dopants into a semiconductor device. More specifically this invention describes a method for diffusing dopants into a substrate from a doped germanium oxide sacrificial layer on a semiconductor substrate.

2. Description of Relevant Art

The processing of a semiconductor, such as a CMOS dual work function device, typically requires doping p+ or n+ dopants into the semiconductor substrate. A patent to Frenette et al., in U.S. Pat. No. 5,770,490, entitled "Method for Producing Dual Work Function CMOS Device" describes the introduction of a dopant from a solid source, involving deposition of a solid layer containing the dopant onto the semiconductor substrate, then diffusing the dopant from the layer into the substrate by heating.

Both silicon dioxide and germanium solid sources have heretofore used strong acids to remove the silicon dioxide or germanium after the diffusion of the dopant into the semiconductor. Unfortunately, etching with strong acids may result in the removal of the silicon dioxide gate oxide and silicon dioxide used to fill standard isolation structures. This may provide paths for charge leakage between regions of different conductivity, resulting in semiconductor device degradation and failure.

SUMMARY OF THE INVENTION

According to a first aspect of the present invention, a method for forming a semiconductor device is provided. The method includes the following steps: forming a doped germanium oxide sacrificial layer on a substrate, wherein the doped germanium oxide sacrificial layer is doped with one of a p+ and n+ dopant; diffusing the dopants into the substrate; and removing the doped germanium oxide sacrificial layer.

According to a second aspect of the present invention, a method for forming a semiconductor device is provided. The method includes the following steps: providing a substrate; forming a germanium oxide sacrificial layer on the substrate; defining a first and second region in the germanium oxide sacrificial layer by forming a protective layer on the second region; doping the first region with one of a p+ and n+ dopant; removing the protective layer on the second region; forming a protective layer on the first region in the germanium oxide sacrificial layer; doping the second region with a second dopant wherein the second dopant is one of a p+ and n+ dopant, and wherein the second dopant is not the same type as the first dopant; removing the protective layer on the first region in the germanium oxide sacrificial layer; diffusing the first and second dopants into the substrate; and removing the doped germanium oxide sacrificial layer.

According to a third aspect of the present invention, a method for forming a semiconductor device is provided. The method includes the following steps: providing a substrate; forming a first doped sacrificial layer of germanium oxide on the substrate wherein the first dopant is one of a p+ and n+ dopant; defining a first and second region in the doped germanium oxide sacrificial layer by forming a protective layer on the first region; removing the second region in the doped germanium oxide sacrificial layer and forming an exposed substrate under the second region; removing the protective layer on the first region in the doped germanium oxide sacrificial layer; forming a second doped sacrificial layer of germanium oxide over the first region and over the exposed substrate wherein the second doped sacrificial layer contains a second dopant and wherein the second dopant is a different type than the first dopant; diffusing the first and second dopants into the substrate; removing the doped germanium oxide sacrificial layers.

According to a fourth aspect of the present invention, a method for forming a semiconductor device is provided. The method includes the following steps: providing a substrate; forming a first doped sacrificial layer of germanium oxide on the substrate wherein the first dopant is one of a p+ and n+ dopant; defining a first and second region in the doped germanium oxide sacrificial layer by forming a protective layer on the first region; removing the second region in the doped germanium oxide sacrificial layer and forming an exposed substrate under the second region; removing the protective layer on the first region in the doped germanium oxide sacrificial layer; doping with one of a second dopant from the group of p+ and n+ dopants into the exposed substrate, wherein the second dopant is different than the first dopant; diffusing the first and second dopants into the substrate; and removing the doped germanium oxide sacrificial layer.

It is therefore an advantage of the present invention to provide a method for forming semiconductor devices using sequential doping of defined regions of a sacrificial film with more than one dopant, and then causing the dopants to diffuse into the appropriate regions of a substrate using a singular anneal. A second advantage of the present invention is that defining only one region of a first doped sacrificial layer and overlaying a second doped sacrificial layer enables dopants to diffuse into the appropriate regions of a substrate with a singular anneal.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
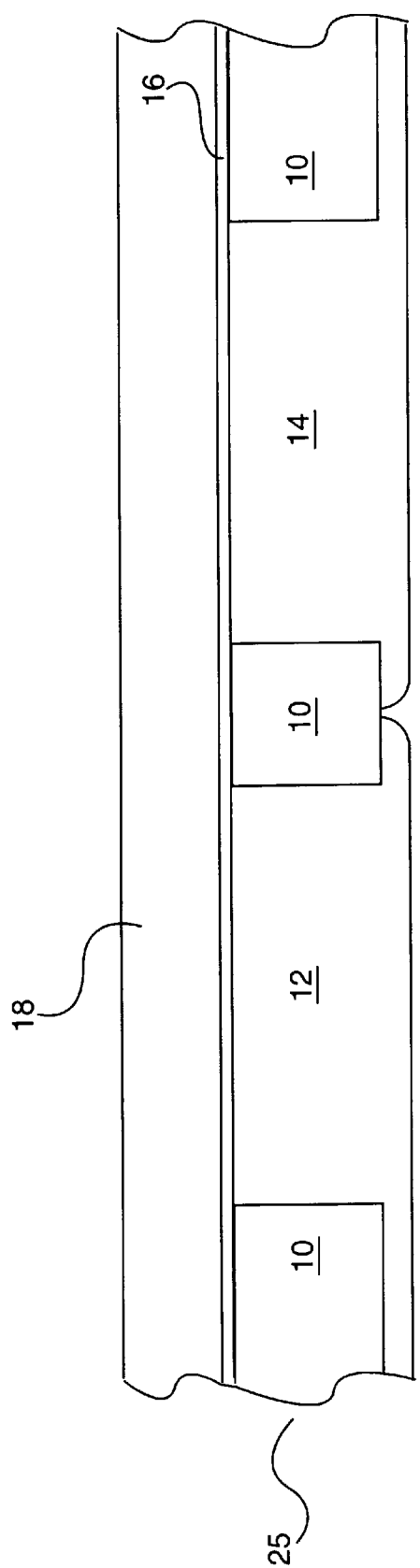
FIGS. 1 and 2 depict a cross sectional view of a substrate, having standard device isolation structures and gates in accordance with a preferred embodiment of the present invention.

It is noted that the drawings of the preferred embodiments of the invention are not to scale. The drawings are merely schematic representations, not intended to portray specific parameters of the invention. The drawings are intended to depict only a typical embodiment of the invention, and therefore should not be considered as limiting the scope of the invention. In the drawings, like numbering represents like elements between the drawings.

DETAILED DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Referring to the drawings, FIGS. 1 through 21 illustrate methods for forming a semiconductor device, preferably a silicon wafer, starting with a p-type doped substrate, although starting with an n-type doped substrate is also possible. The substrate 25 can be bulk silicon or silicon on insulator (SOI) substrate. The substrate 25 is preferably silicon although other semiconductor materials such as SiGe and SiC are also possible.

FIGS. 1–11 depict a method for forming a semiconductor device which involves depositing a germanium oxide sacrificial layer 26 on a substrate 25 and selectively doping the layer 26, according to a first embodiment of the present invention.

Figure 2:
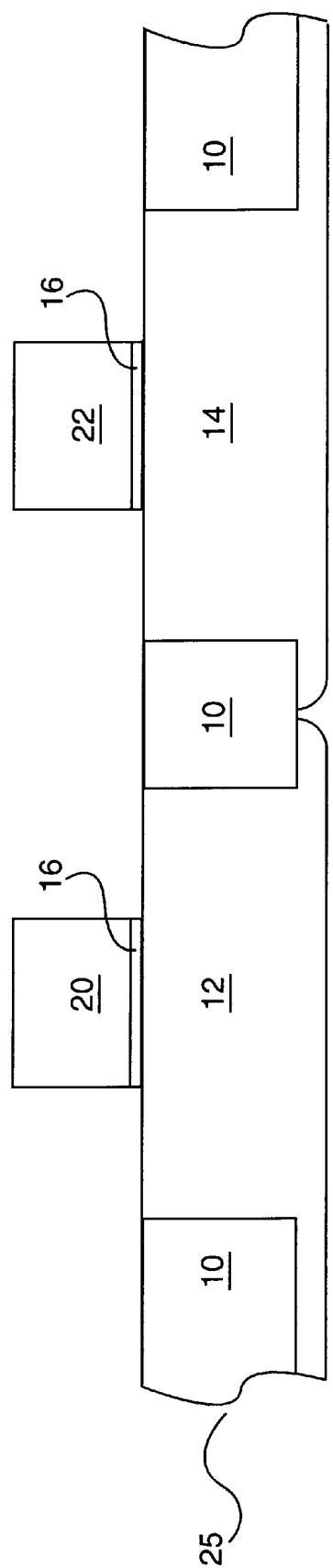
Figure 3:
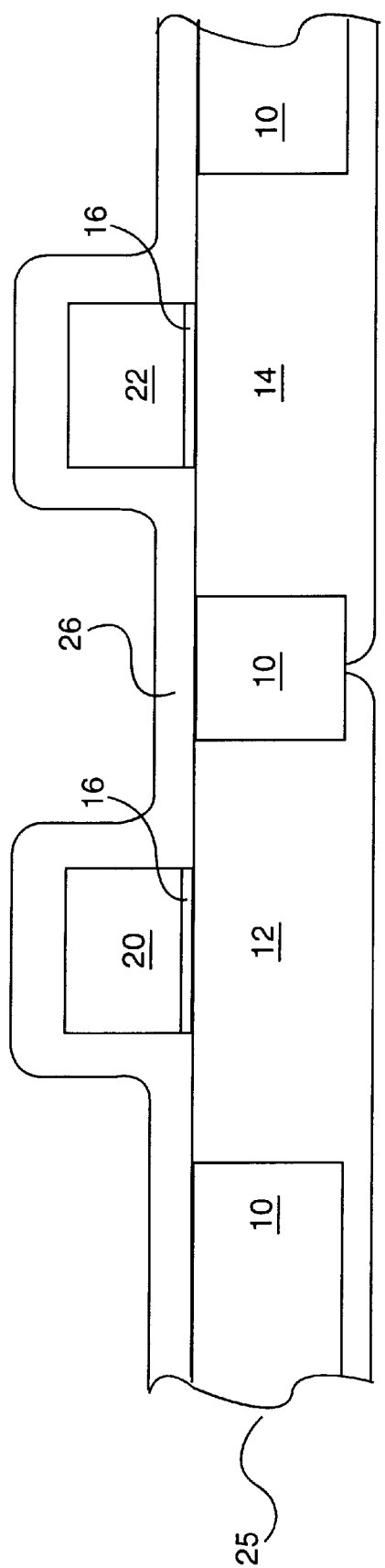
FIGS. 3–11 depict a method of forming a simiconductor device, in accordance with a first embodiment of the present invention.

As illustrated in FIG. 1, standard device isolation structures 10, are formed in the substrate 25 and are filled with silicon dioxide using chemical vapor deposition (CVD) followed by chemical/mechanical polishing (CMP) planarization. Regions of different conductivity comprising p-wells 12 or n-wells 14 are then ion implanted into the substrate 25, wherein a portion of the substrate 25 is protected by a lithographically defined photoresist and a remaining portion is ion implanted to form the p-wells 12 or n-wells 14. Hereinafter, the term "defining a substrate" means protecting a portion of a substrate 25 using a lithographically defined photoresist and removing a remaining unprotected potion of the substrate 25. A silicon dioxide gate dielectric layer 16 is thermally grown on the substrate 25, wherein the layer 16 has a thickness less than about 6 nm. Alternatively, the layer 16 can be formed from one of the group of silicon oxy-nitride, silicon nitride, titanium dioxide, aluminum oxide, tantalum pentoxide, etc., or any combinations thereof, preferably using chemical vapor deposition (CVD), or in the alternative, physical vapor deposition (PVD). An undoped polysilicon layer 18 is then deposited on the layer 16, wherein the thickness of the undoped polysilicon layer 18 is about 50 nm to about 200 nm. Alternatively, other material such as, polysilicon germanium, W, Al, Ta, Ti or other metal or metal silicide may be used instead of polysilicon. FIG. 2 depicts formation of gates 20 and 22 on the substrate 25 using conventional defining and etching techniques.

According to a first embodiment, FIG. 3a shows an undoped amorphous germanium oxide sacrificial layer 26, having a thickness in the range of about 50 nm to about 200 nm, is deposited on the substrate 25, using CVD or PVD or in the alternative, layer 26 may be deposited via jet vapor deposition (JVD), sputtering, etc. Alternatively, layer 26 may be formed by depositing an undoped layer of polygermanium having a thickness in the range of about 20 nm to about 100 nm on the substrate 25, and then heating the undoped polygermanium layer in the range of about 600° C. to about 700° C. in an oxidizing atmosphere.

Figure 4:
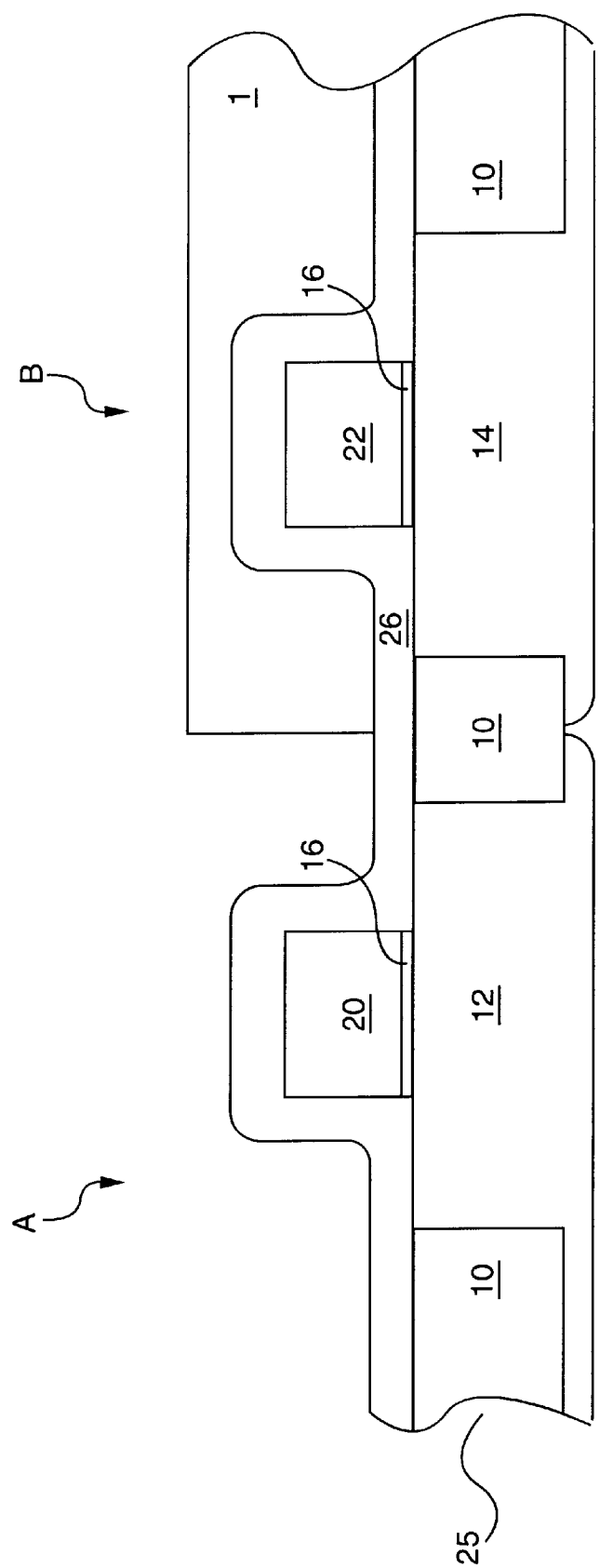

Referring to FIG. 4, a photoresist 1 is deposited on a region B of the substrate 25 over the n-well 14, leaving a region A in layer 26 over the p-well 12 exposed. The step of depositing the photoresist 1 may also include first depositing an organic anti-reflective layer (ARC), such as CD-11 or DUV-30 (available from Brewer Science) on the layer 26 in region B of the substrate 25 over the n-well 14. The ARC is spin-applied, usually to a thickness of 50–120 nm, from a liquid solution, similar to the process used for photoresist apply. The ARC, in this process, serves to prevent the resist developer from dissolving the layer 26 during the resist develop.

Figure 5:
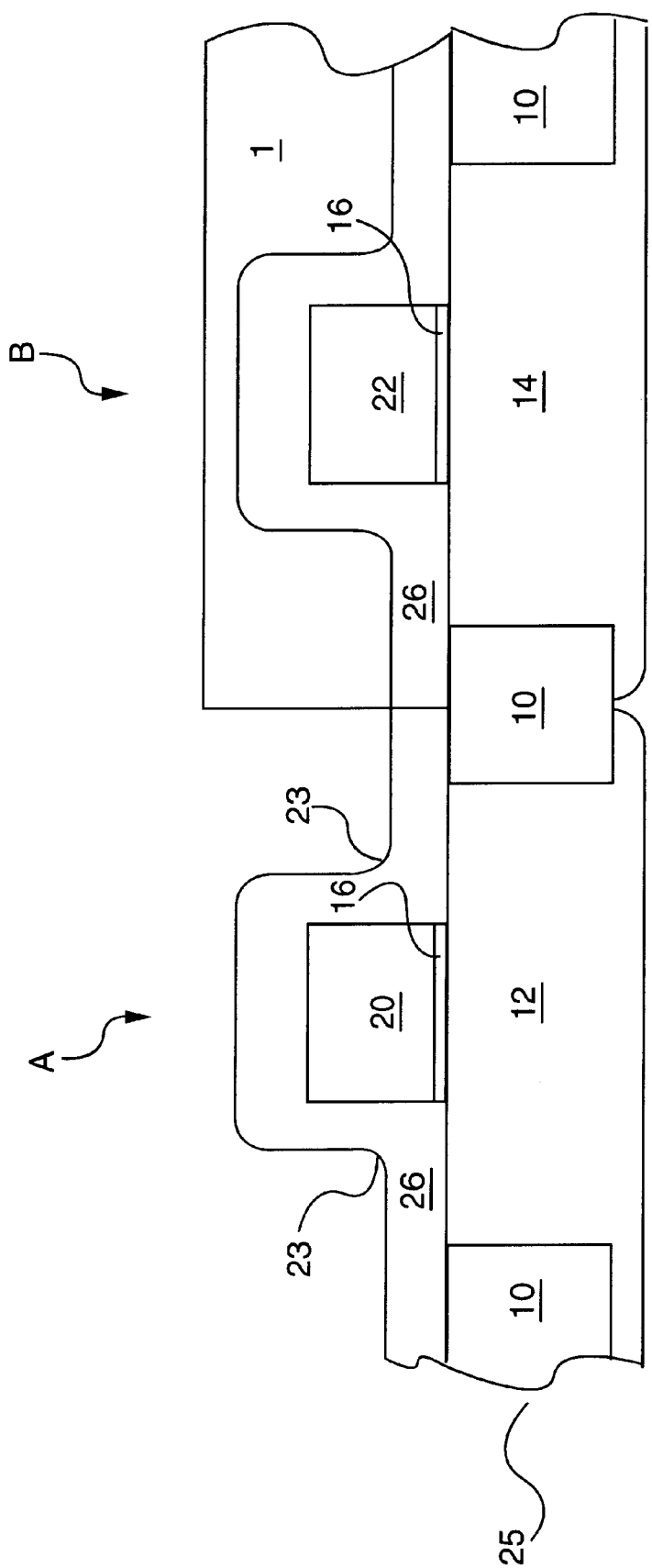

In FIG. 5, an n+ dopant, such as arsenic, is ion implanted into the exposed region A of the substrate 25 over the p-well 12, forming a first doped p+ region of a layer 26. The dopant is implanted using an acceleration energy from about 50 KeV to about 150 KeV and wherein a dose of arsenic is greater than about $1E^{16}$ ions/cm$^2$ and preferably is in the range of about $1E^{17}$ to about $1E^{18}$ ions/cm$^2$. Alternatively, ion implantation of phosphorous into the exposed region A of the layer 26 over the p-well 12 using an acceleration energy from about 25 KeV to about 75 KeV and wherein a dose of phosphorous is greater than about $1E^{16}$ ions/cm$^2$ and preferably in the range of about $1E^{17}$ to about $1E^{18}$ ions/cm$^2$. Ion implanting about the gate structure 20 at an angle between about 30° and about 45°, and between about 135° and about 150° with respect to the surface of the substrate 25 ensures doping of the layer 26 where there are right angle junctions 23 of the gate 20 with the amorphous germanium oxide layer 26.

Figure 6A:
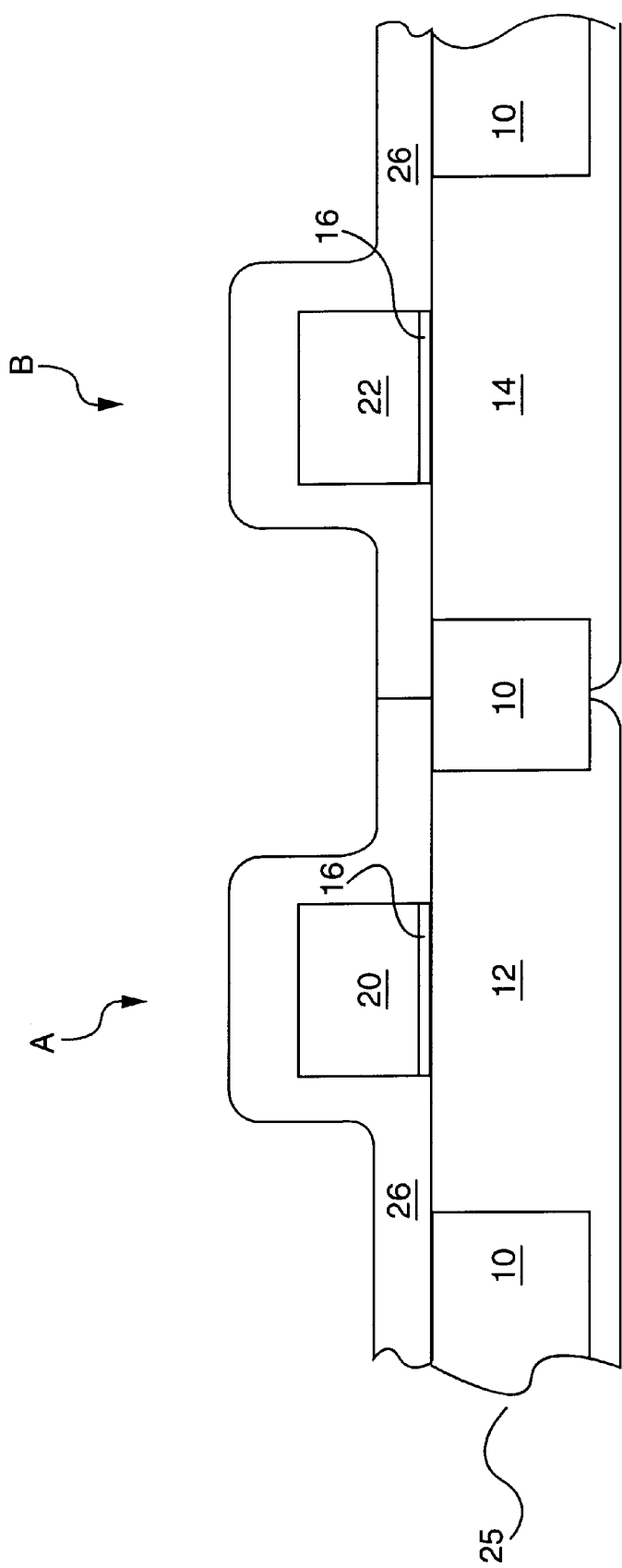
Figure 7A:
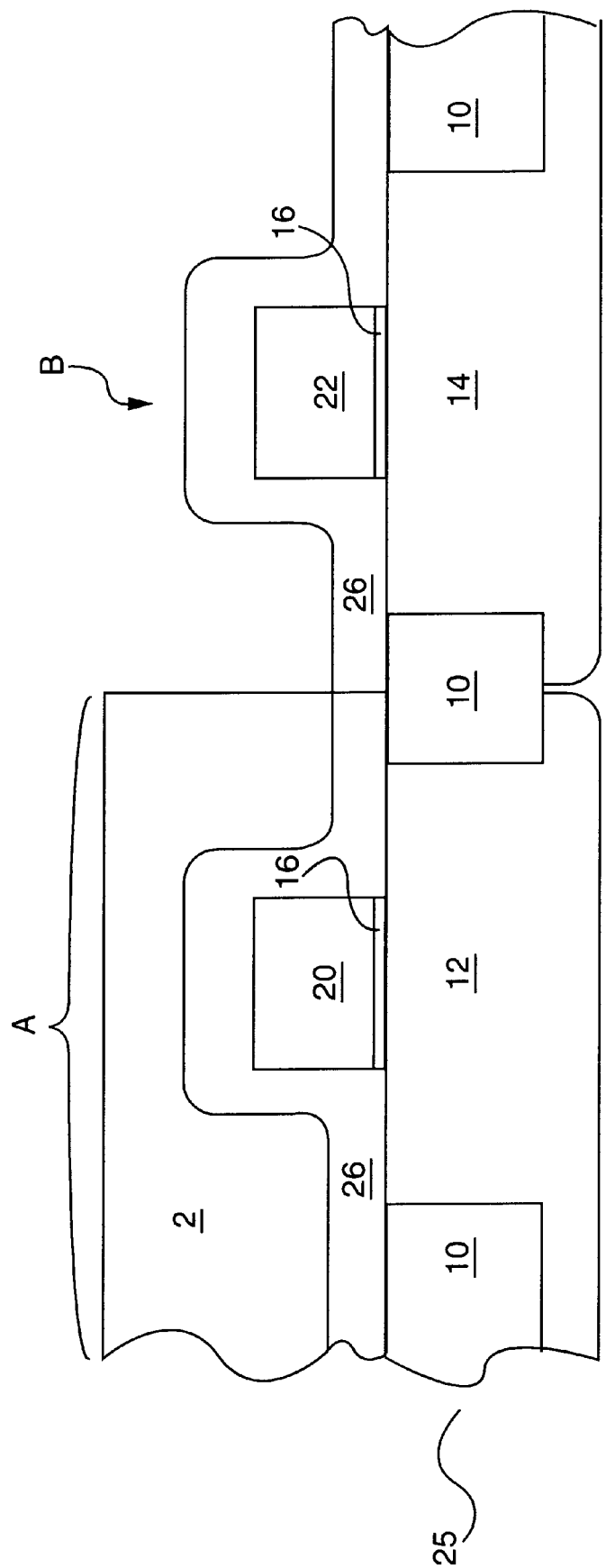
Figure 8A:
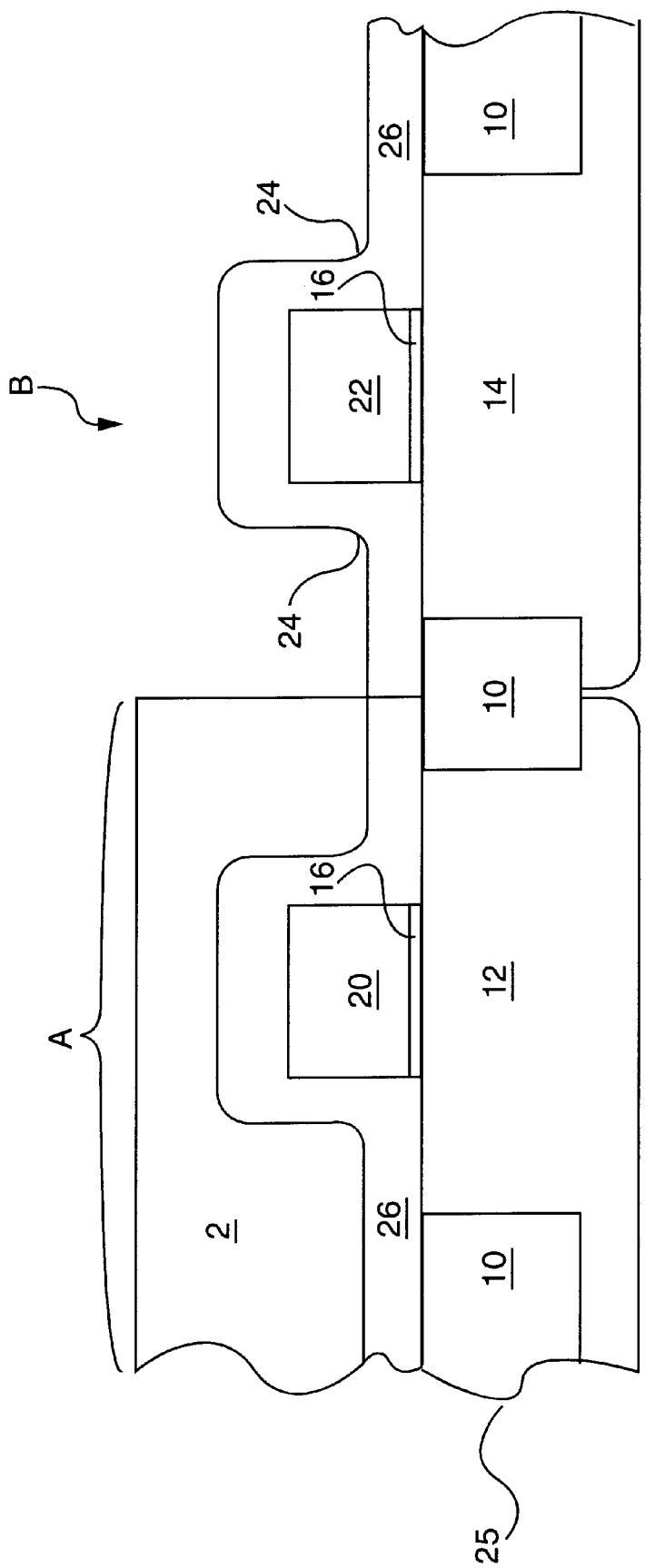

In FIG. 6a, a photoresist 1 over the n-well 14 has been removed using ashing. The ARC can be removed with the photoresist in an ashing process, e.g., oxygen plasma, ozone vapor, etc. Referring to FIG. 7a, a photoresist 2 is deposited on region A of the substrate 25 over the p-well 12, leaving region B in layer 26 over the n-well 14 exposed. In FIG. 8a, boron ions are ion implanted into region B in the layer 26 using an acceleration energy from about 10 KeV to about 30 KeV and wherein a dose of boron is greater than about $1E^{16}$ ions/cm$^2$ and preferably in the range of about $1E^{17}$ to about $1E^{18}$ ions/cm$^2$. Ion implanting about the gate structure 22 at an angle between about 30° and about 45°, and between about 135° and about 150° with respect to the surface of the substrate 25 ensures doping of the layer 26 where there are right angle junctions 24 of the gate 21 with the amorphous germanium oxide layer 26.

Figure 6B:
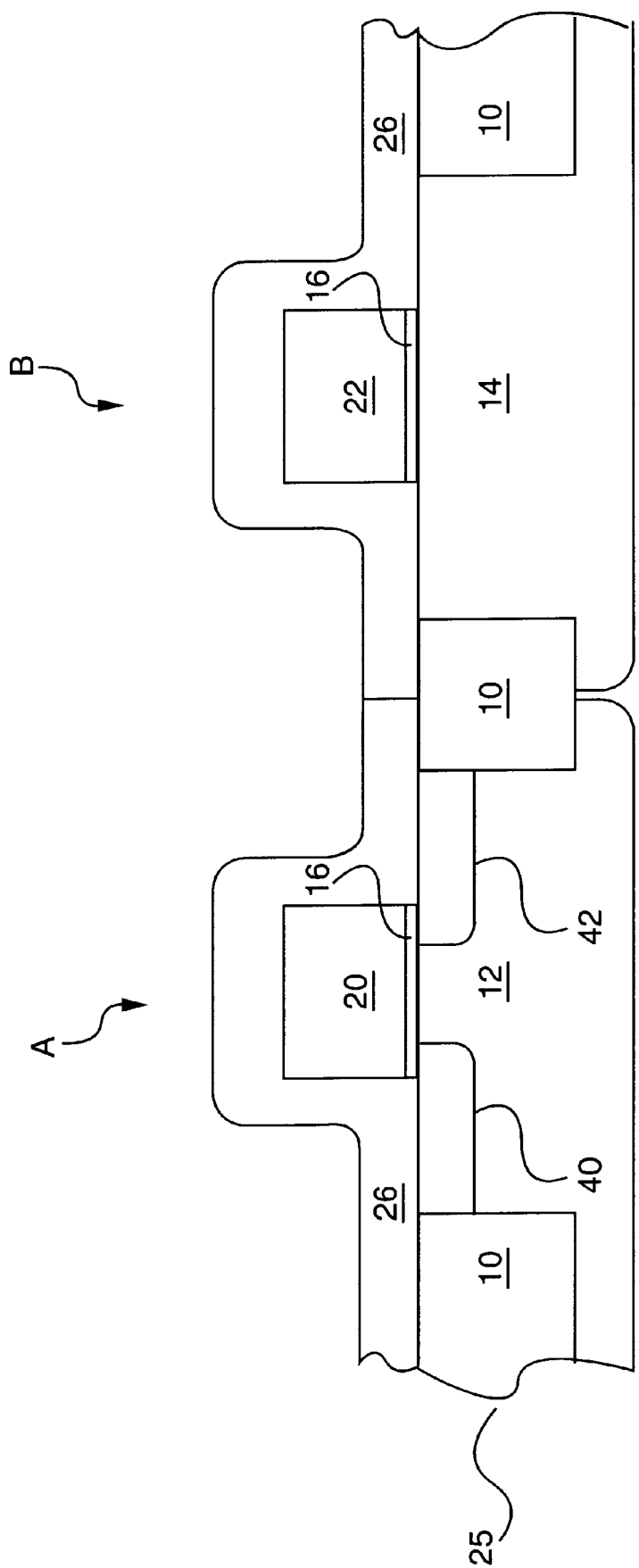
Figure 7B:
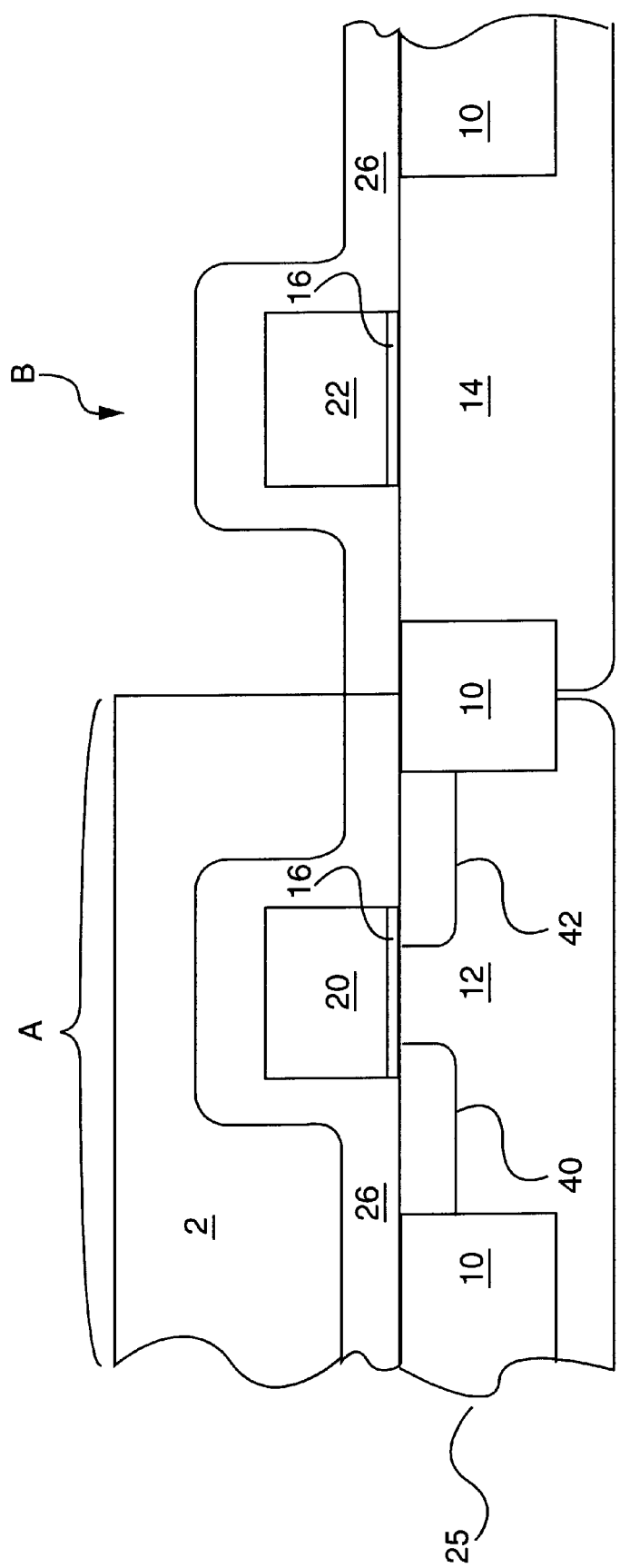
Figure 8B:
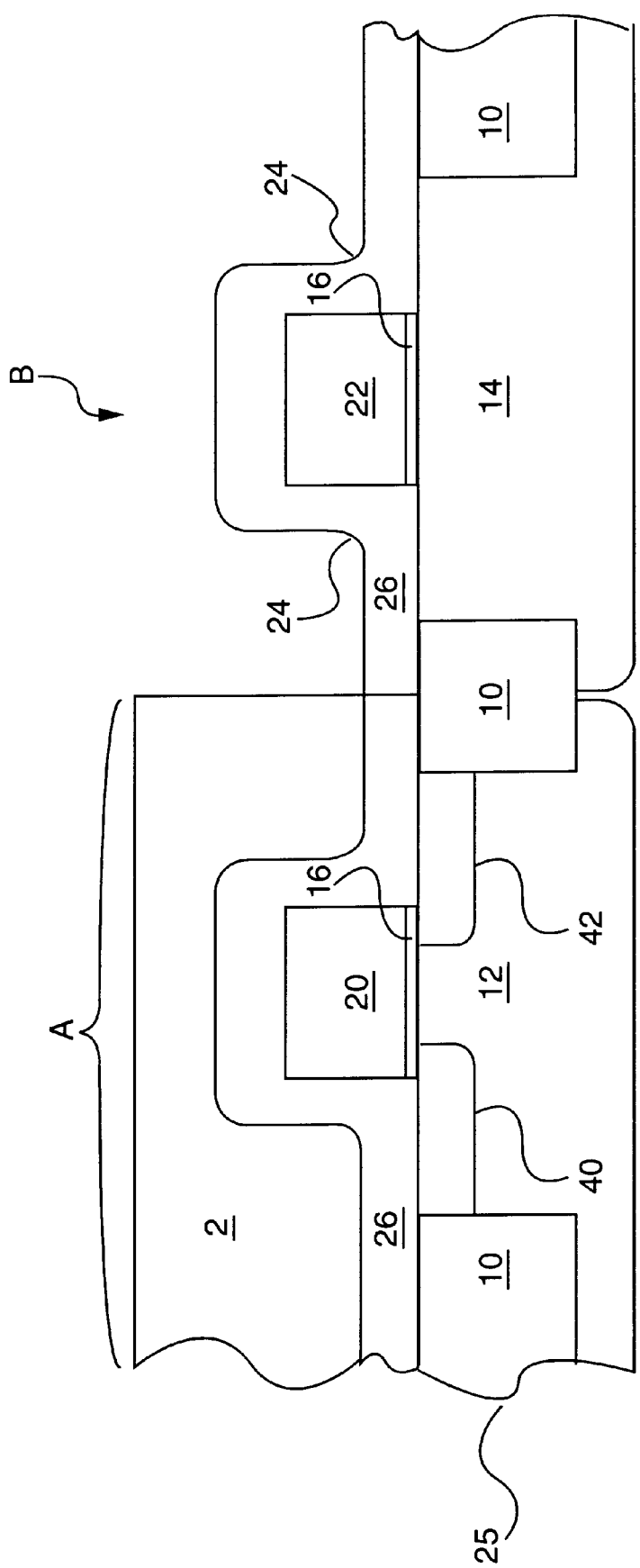
Figure 9:
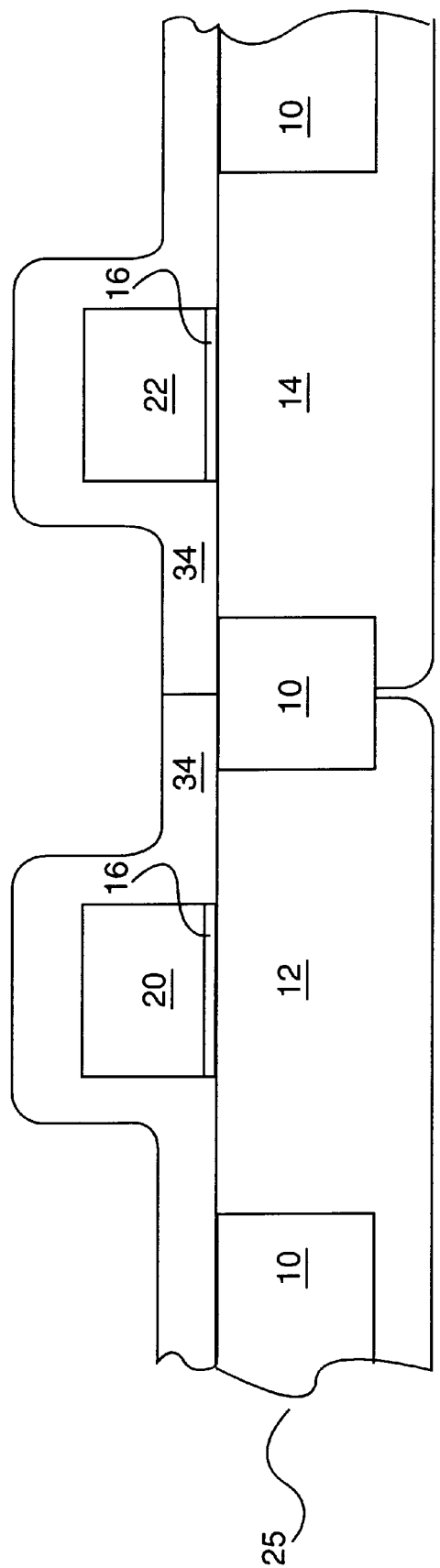

Alternatively, referring to FIG. 6b, in addition to removing a photoresist 1 over the n-well 14, the substrate 25 is heated from about 800° C. to about 1200° C. using rapid thermal anneal (RTA) or furnace anneal, to give a first dopant, such as arsenic, a head start, forming an n+ source 40 and drain, 42. In FIG. 7b, a region A is defined in the sacrificial layer over a p-well 12, using photoresist 2, leaving a region B over the n-well 14 exposed. In FIG. 8b, boron ions are ion implanted into the exposed region B in layer 26 where there are right angle junctions 24 of the gate 21 with the amorphous germanium oxide layer 26, using an acceleration energy from about 10 KeV to about 30 KeV and wherein a dose of boron is greater than about $1E^{16}$ ions/cm$^2$ and preferably in the range of about $1E^{17}$ to about $1E^{18}$ ions/cm$^2$. Ion implanting about the gate structure 22 at an angle between about 30° and about 45°, and between about 135° and about 150° with respect to the surface of the substrate 25 ensures doping of the layer 26 where there are right angle junctions 24 of the gate 21 with the amorphous germanium oxide layer 26. In FIG. 9, a photoresist 2 over the p-well 12 is removed using ashing.

Figure 10:
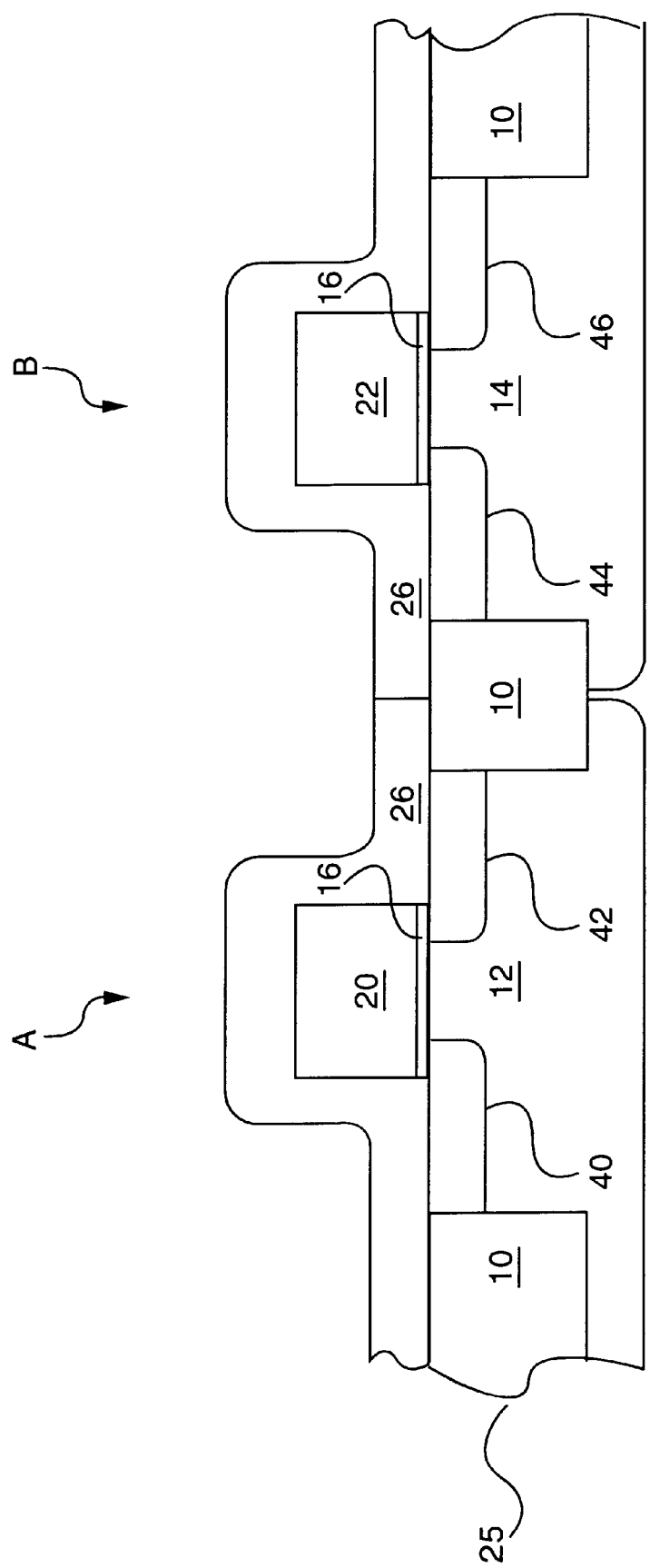

FIG. 10 depicts heating the substrate 25 from about 800° C. to about 1200° C. using rapid thermal anneal (RTA), wherein dopants in layer 26 diffuse into the substrate 25, forming a first source 40 and a first drain 42 having an n+ dopant and a second source 44 and second drain 46 having a p+ dopant. Annealing at lower temperatures for longer duration is an alternative. Conventional furnace anneal may be used as an alternative to RTA.

Figure 11:
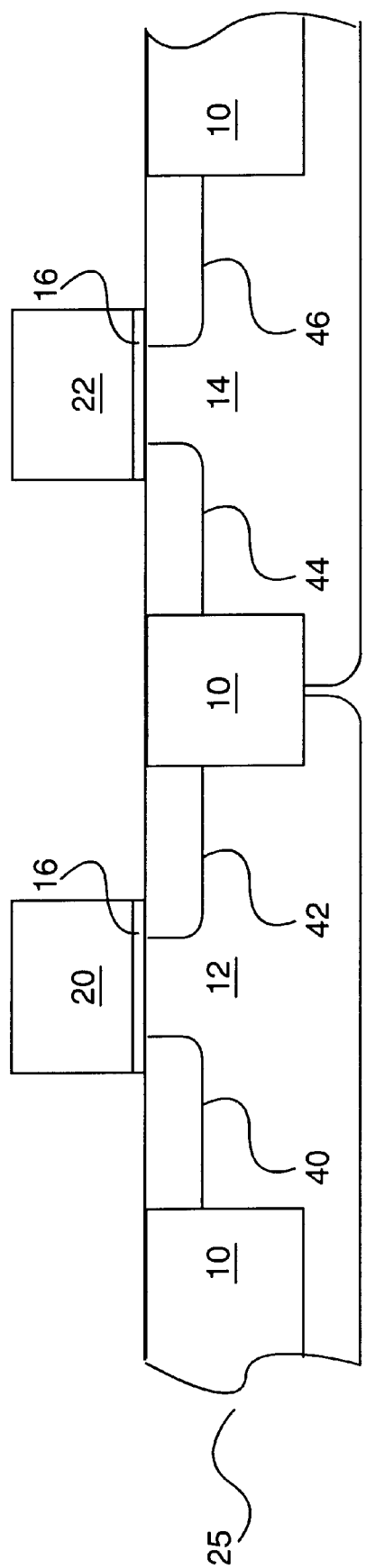

In FIG. 11, layer 26 is removed using water, wherein the water is heated to a temperature between about 18° C. and 100° C. Removal with water instead of strong acids is less aggressive to $SiO_2$ and avoids pitting of the gate oxide 16 or removal of $SiO_2$ in standard device isolation structures 10, that may lead to device degradation and failure.

FIGS. 1–2 and 12–18, depict a method for forming a semiconductor device which involves overlaying a second sacrificial layer 38 on the first layer 35, according to a second embodiment of the present invention. In FIGS. 1 and 2 standard isolation structures 10 and gates 20 and 22 are formed in the manner similar to that described in the first embodiment.

Figure 12:
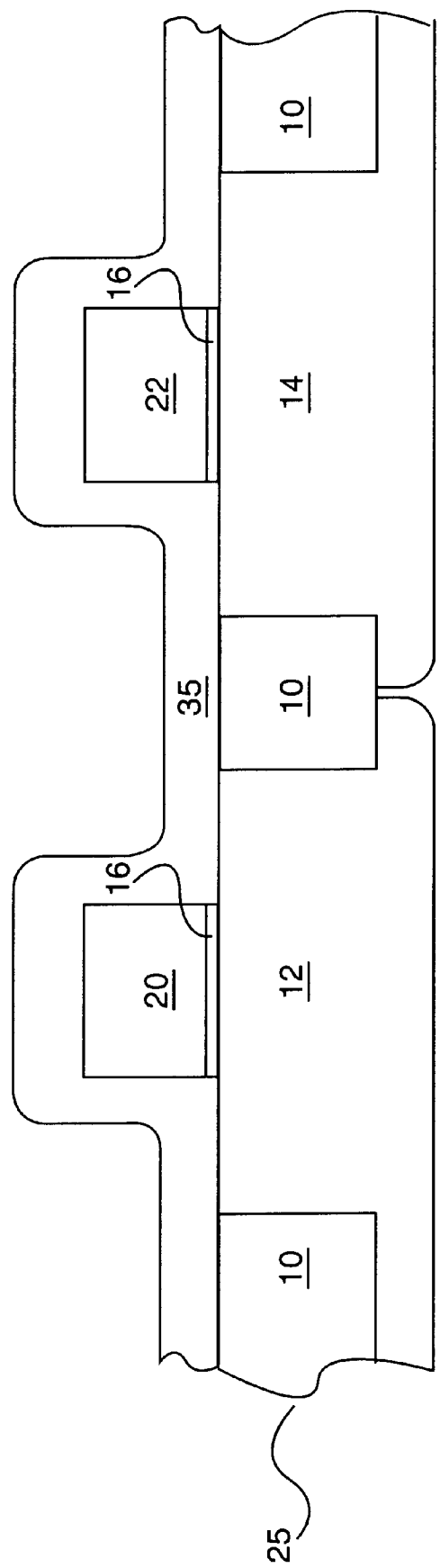
FIGS. 12–17 depict a method of forming a semiconductor device, in accordance with a second embodiment of the present invention.
Figure 13:
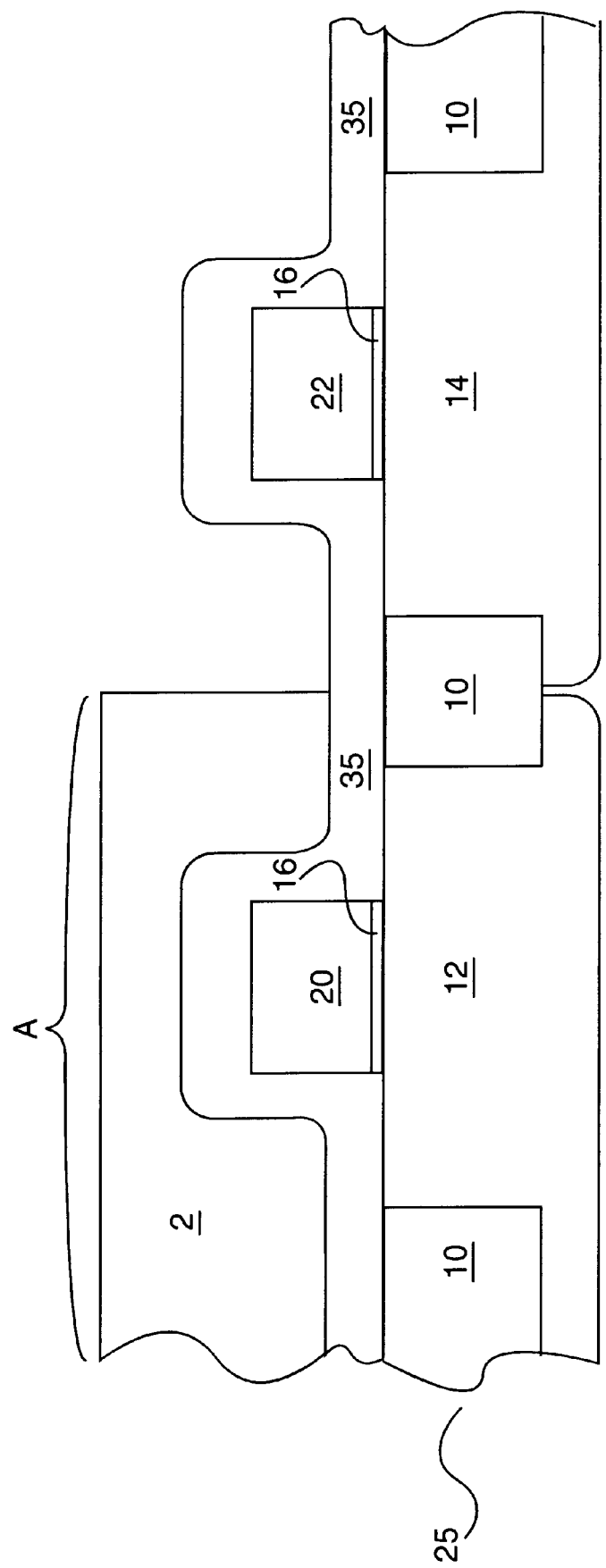
Figure 14:
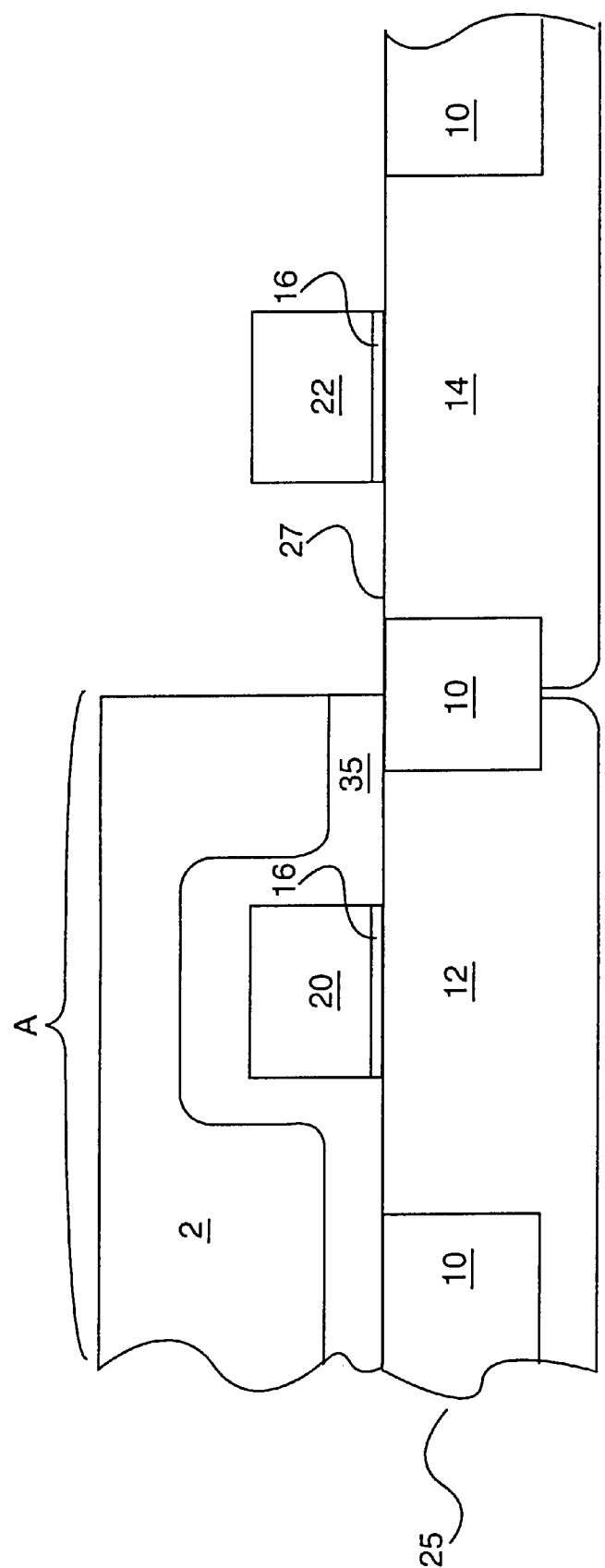

In FIG. 12 an arsenic doped germanium oxide sacrificial layer 35 is formed, having a thickness in the range of about 50 nm to about 200 nm on a substrate 25, according to a second embodiment of the present invention. FIGS. 13 and 14 depict defining a protected region A of the doped germanium oxide sacrificial layer 35, and exposing a region B of the doped layer 35. FIG. 14 depicts wet etching with water to remove region B of layer 35, thereby further exposing surface 27 of substrate 25 over n-well 14. If an ARC is used between the photoresist 2 and layer 35, it is necessary to remove the ARC from the exposed region B in layer 35 with an oxygen etch, prior to the water etch of region B in layer 35. In some processes, it may be possible to eliminate the use of the ARC, and use the resist develop (which is usually an aqueous solution) to develop the resist and remove region B in layer 35 to expose surface 27 of substrate 25. Due to difficulties in optimizing the processes for both the resist develop and the etch of region B in the layer 35, it will usually be desirable to use an ARC between the photoresist 2 and layer 35, so these processes can be separately optimized.

Figure 15A:
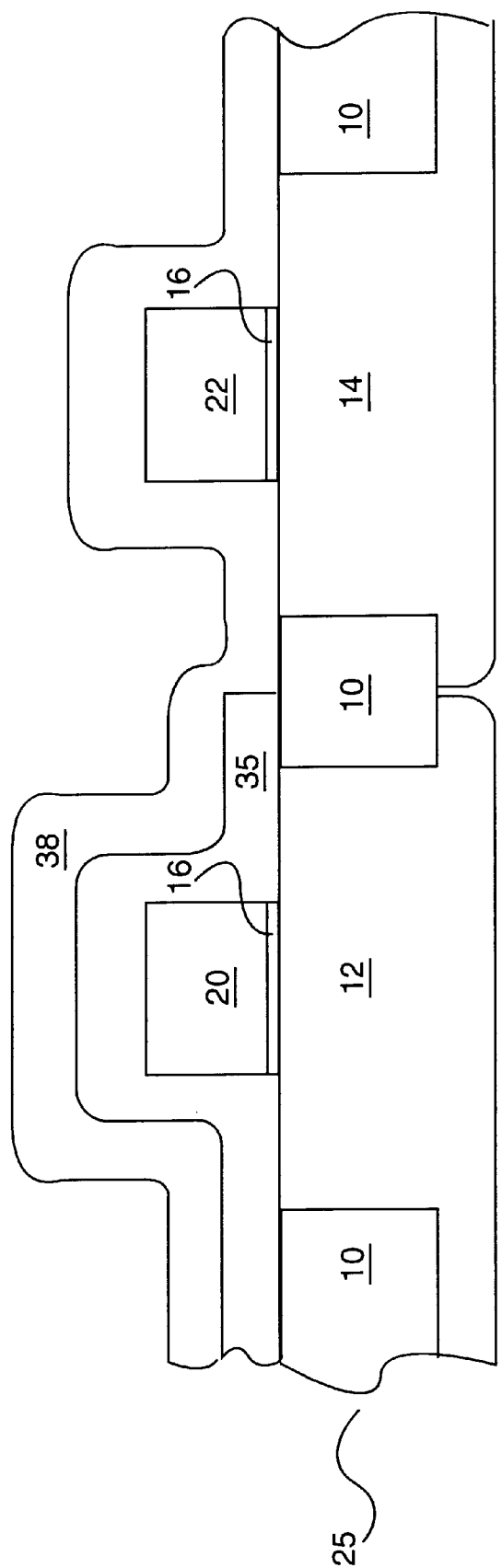

Referring to FIG. 15a, photoresist 2 is removed and a second doped germanium oxide sacrificial layer 38, having a different type dopant than the first doped layer is formed over the surface of the substrate 25. Alternatively, an undoped germanium oxide layer of about 50 nm thickness may be deposited between the first doped germanium oxide layer 35 and the second doped germanium oxide layer 38, if necessary, to block the dopant in layer 38 from diffusing into the substrate 25 over the p-well 12 during anneal. Alternatively, after removing photoresist 2, layer 38 may be formed by depositing a layer of polygermanium having a different type dopant than layer 35 on the layer 35, followed by heating the polygermanium layer in the range of about 600° C. to about 700° C. in an oxidizing atmosphere.

Figure 18:
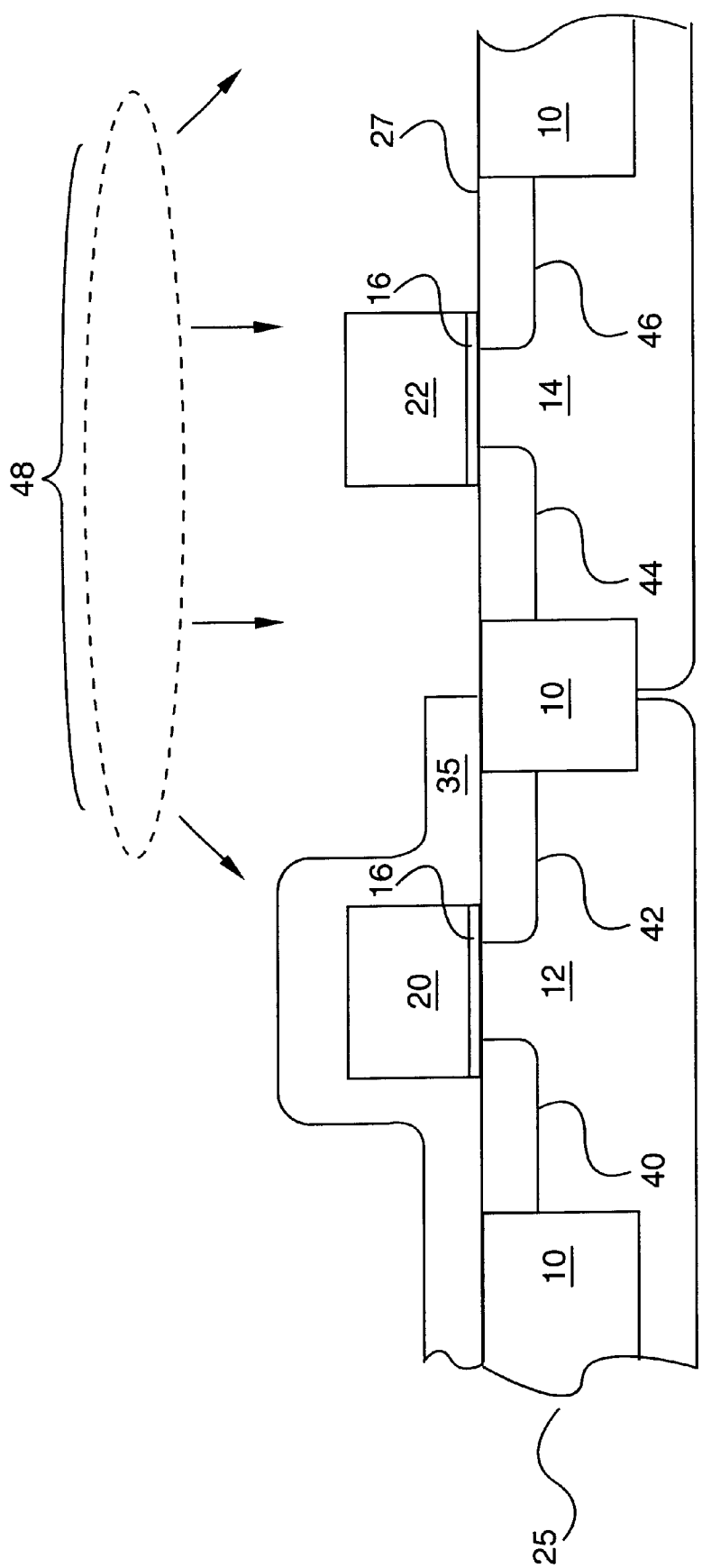
FIGS. 18–21 depict a method of forming self aligned, butted junctions, in accordance with the second embodiment of the present invention.
Figure 19:
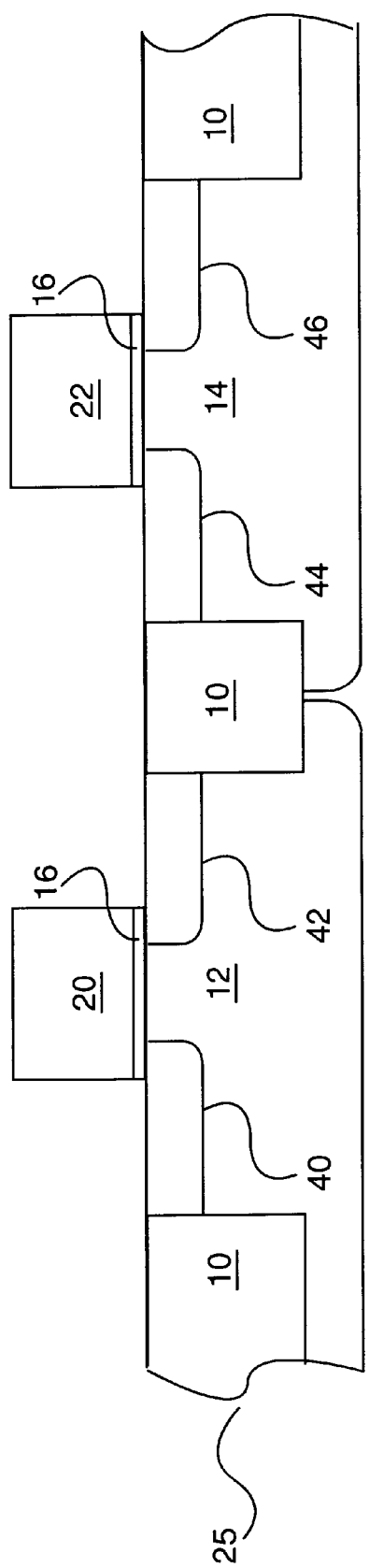

Alternatively, referring to FIG. 15a, after photoresist 2 is removed, substrate 25 is exposed to boron dopant gas 48, such as $B_2H_6$, at a temperature from about 800° C. to about 1200° C. and arsenic dopant diffusing from first doped germanium oxide sacrificial layer 35. As depicted in FIG. 18, the dopant in layer 35, wherein the dopant includes arsenic, diffuses into substrate 25, forming a source and a drain, 40 and 42. Also depicted in FIG. 18, gas phase doping using diborane 48, results in formation of the source and the drain 44 and 46. In FIG. 19, the doped layer 35 is removed using water, wherein the water is heated to a temperature between about 18° C. and 100° C.

Figure 16:
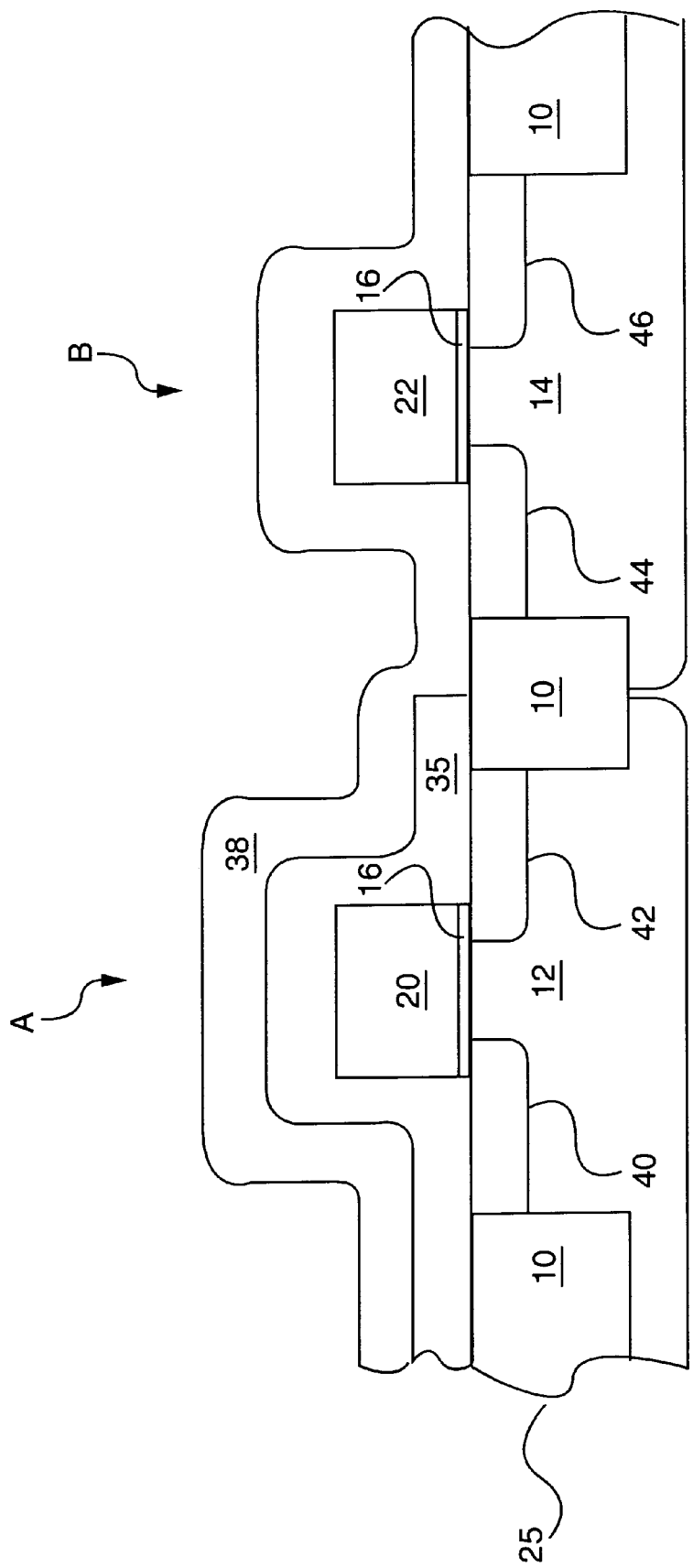
Figure 17:
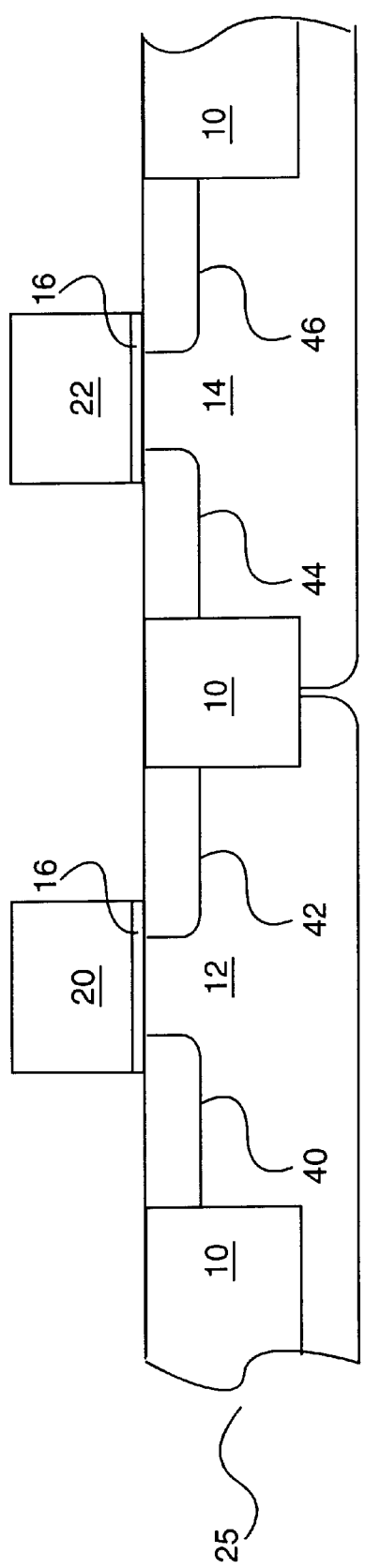

In FIG. 16, RTA diffuses the dopants into the substrate 25 such that the source 40 and the drain 42 having an n+ dopant and the source 44 and the drain 46 having a p+ dopant are formed in the substrate 25. An advantage of the second embodiment of the present invention is that it is only necessary to define one region A of the first doped sacrificial layer 35 in order to dope the substrate 25 such that the source 40 and the drain 42 having an n+ dopant and the source 44 and the drain 46 having a p+ dopant are formed in substrate 25.

Figure 15B:
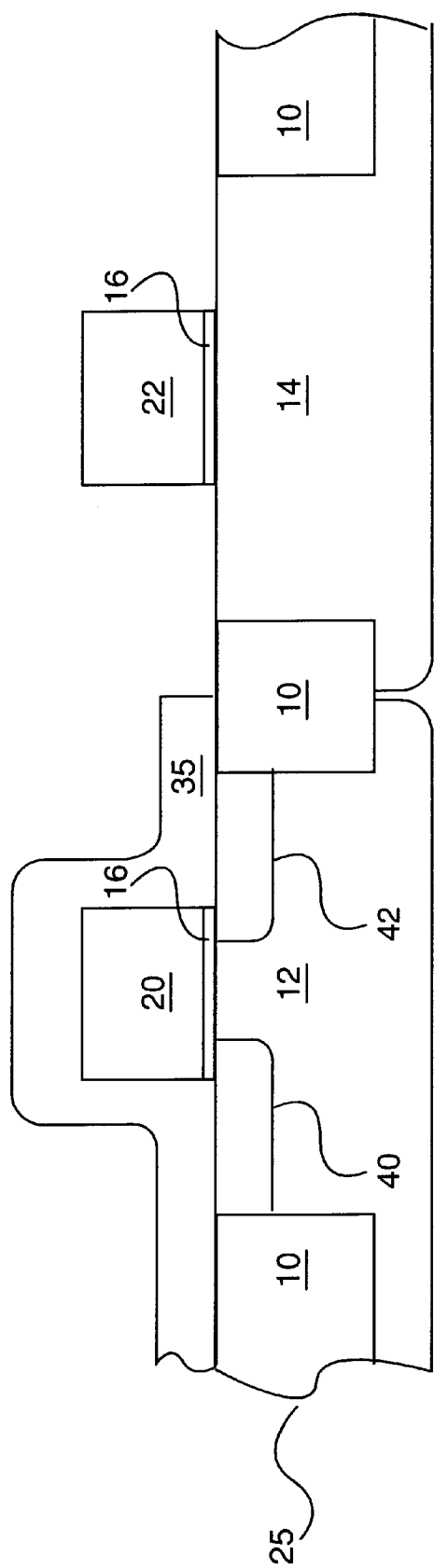

Alternatively, in FIG. 15b, heating layer 35 to temperatures from about 800° C. and 1200° C. diffuses the dopant in layer 35 into the substrate 25, forming the source 40 and the drain 42, thereby giving the dopant in layer 35 a head start.

Figure 20:
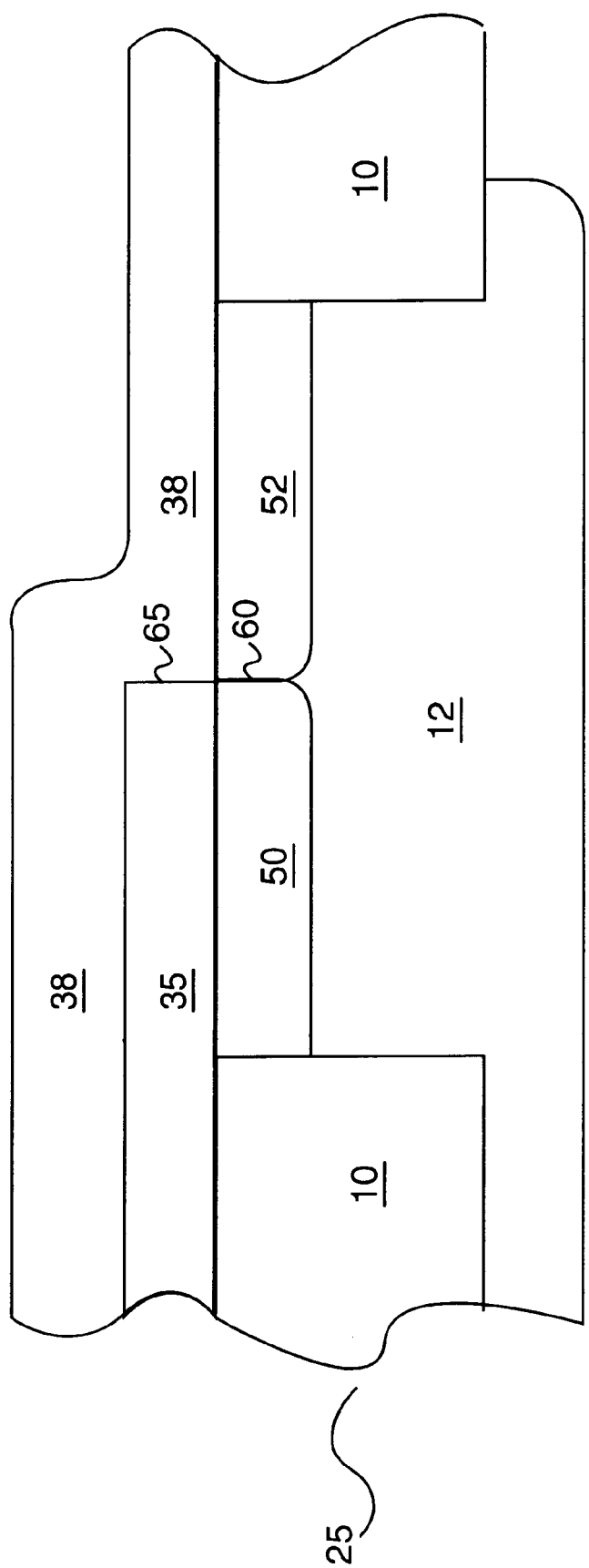

In FIG. 20, annealing the substrate 25 from about 800° C. to about 1200° C. forms a junction 50, containing a first dopant from layer 35 and junction 52, containing a second dopant from layer 38, such that the interface 60 between the junctions 50 and 52 is aligned in the same plane as the interface 65 between layer 35 and layer 38, resulting in self aligned interfaces 60 and 65, such that junctions 50 and 52 are self aligned butted junctions.

Figure 21:
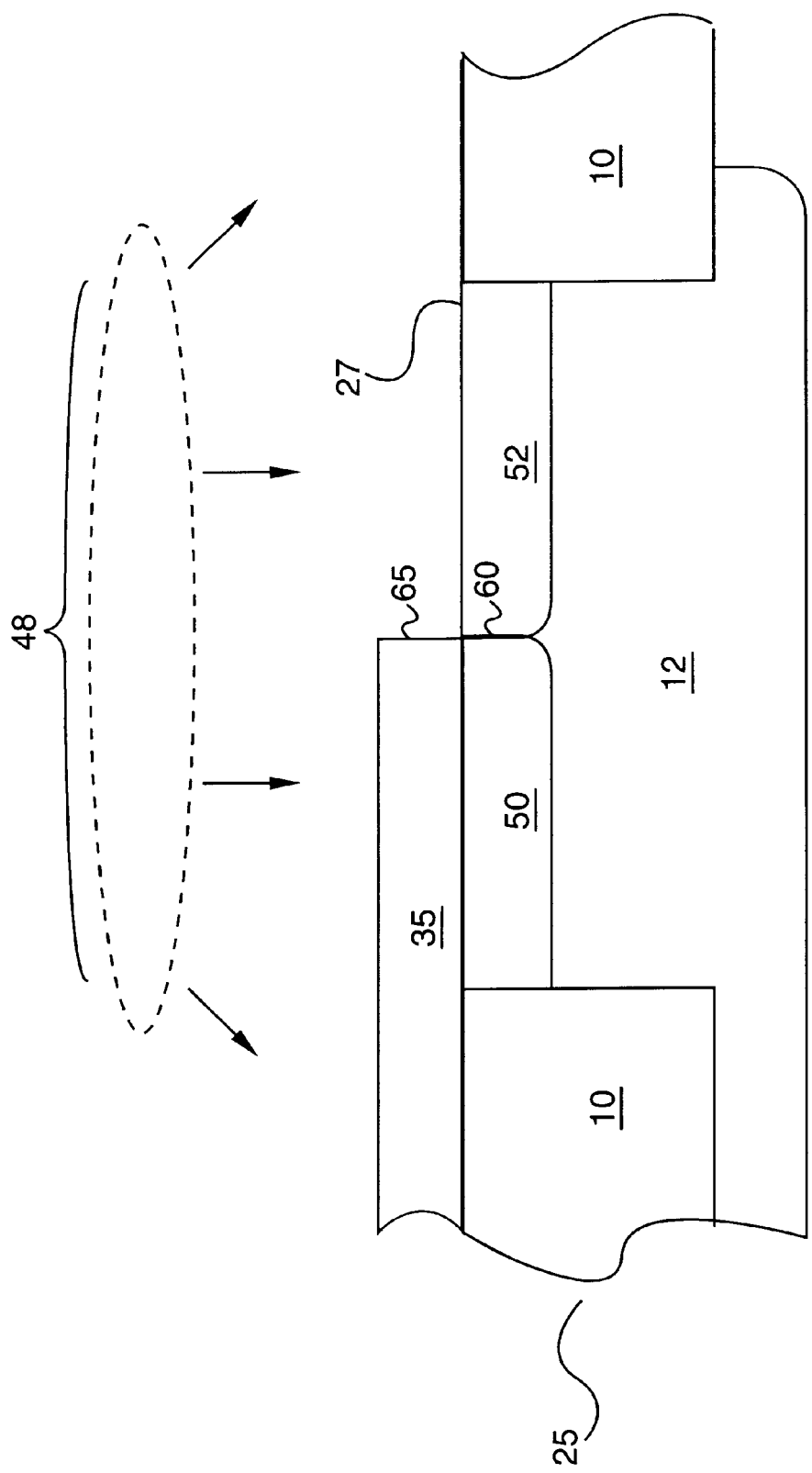

In the alternative, as depicted in FIG. 21, layer 35 having a first dopant is defined on the substrate 25 using the method of the second embodiment. Gas phase doping 48, using a gas phase dopant such as diborane, of the substrate 25, a portion of which is protected by layer 35, and a remaining portion that is exposed to the gas phase dopant 48, forms the junction 50 containing the first dopant and the junction 52 containing the gas phase dopant, such that the interface between them 60, is aligned in the same plane as the interface between the first dopant source and an exposed surface 27 of the substrate 25, resulting in self aligned interfaces 60 and 65, such that junctions 50 and 52 are self aligned butted junctions.

We claim:

1. A method for forming a semiconductor device comprising the steps of:
   depositing a germanium oxide sacrificial layer on a substrate wherein the germanium oxide sacrificial layer is doped with one of a p+ and n+ dopant;
   diffusing the dopant into the substrate; and
   removing the doped germanium oxide sacrificial layer.

2. A method for forming a semiconductor device comprising the steps of:
   forming a doped germanium oxide sacrificial layer on a substrate, wherein the doped germanium oxide sacrificial layer is doped with one of a p+ and n+ dopant;
   providing an undoped polygermanium sacrificial layer on the substrate;
   doping the undoped polygermanium sacrificial layer with one of a p+ and n+ dopant;
   oxidizing the doped polygermanium sacrificial layer to form a doped germanium oxide sacrificial layer on the substrate;
   diffusing the dopant into the substrate; and
   removing the doped germanium oxide sacrificial layer.

3. The method of claim 1, wherein the step of diffusing the dopants further comprises the step of heating to a temperature of about 800° C. to about 1200° C.

4. A method for forming a semiconductor device comprising the steps of:
   forming a doped germanium oxide sacrificial layer on a substrate, wherein the doped germanium oxide sacrificial layer is doped with one of a p+ and n+ dopant;
   diffusing the dopant into the substrate; and
   removing the doped germanium oxide sacrificial layer by etching the doped germanium oxide sacrificial layer with water having a temperature of about 18° C. to about 100° C.

5. A method for forming a silicon semiconductor device comprising the steps of:
   providing a substrate;
   forming a germanium oxide sacrificial layer on the substrate;
   defining a first and second region in the germanium oxide sacrificial layer by forming a protective layer on the second region;
   doping the first region with one of a p+ and n+ dopant;
   removing the protective layer on the second region;
   forming a protective layer on the first region in the germanium oxide sacrificial layer;
   doping the second region with a second dopant wherein the second dopant is one of a p+ and n+ dopant, and wherein the second dopant is not the same type as the first dopant;
   removing the protective layer on the first region in the germanium oxide sacrificial layer;
   diffusing the first and second dopants into the substrate; and
   removing the doped germanium oxide sacrificial layer.

6. The method of claim 5, further comprising before the step of forming a protective layer on the first region in the germanium oxide sacrificial layer, the step of heating the substrate to between about 800° C. and about 1200° C., thereby providing a head start for the first dopant.

7. The method of claim 5, wherein the step of removing the doped germanium oxide sacrificial layer further comprises the step of etching with water having a temperature of about 18° C. to about 100° C.

8. A method for forming a silicon semiconductor device comprising the steps of:
   providing a substrate;
   forming a first doped sacrificial layer of germanium oxide on the substrate wherein the first dopant is one of a p+ and n+ dopant;
   defining a first and second region in the doped germanium oxide sacrificial layer by forming a protective layer on the first region;
   removing the second region in the doped germanium oxide sacrificial layer and forming an exposed substrate under the second region;
   removing the protective layer on the first region in the doped germanium oxide sacrificial layer;
   forming a second doped sacrificial layer of germanium oxide over the first region and over the exposed substrate wherein the second doped sacrificial layer contains a second dopant and wherein the second dopant is a different type than the first dopant;
   diffusing the first and second dopants into the substrate; and
   removing the doped germanium oxide sacrificial layers.

9. The method of claim 8, wherein the step of defining a first and second region further comprises the steps of forming a photoresist material as the protective layer on the first region.

10. The method of claim 8, wherein the second sacrificial layer has a thickness of about 200 nm.

11. The method of claim 8, wherein before the step of forming the second sacrificial layer over the first region and over the exposed substrate further comprises the step of:
   forming an intermediate undoped germanium oxide sacrificial layer over the first region and the substrate; and
   after forming the second sacrificial layer, annealing the substrate wherein the undoped layer delays diffusion of the second dopant.

12. The method of claim 8, further comprising before the step of forming a second sacrificial layer, the step of heating the substrate to between about 800° C. and about 1200° C., thereby providing a head start for the first dopant.

13. The method of claim 8, wherein the step of, diffusing the first and second dopants into the substrate, further comprises the step of heating the substrate from about 800° C. to about 1200° C.

14. The method of claim 8, wherein the step of removing the doped germanium oxide sacrificial layers further comprises the step of etching with water having a temperature of about 18° C. to about 100° C.

15. The method of claim 8, wherein the step of forming a second sacrificial layer of germanium oxide over the first region and over the exposed substrate further comprises the steps of:
   forming a second doped sacrificial layer of polygermanium over the first region and over the exposed substrate; and
   oxidizing the second doped sacrificial layer of polygermanium.

16. The method of claim 15, wherein the step of oxidizing the second doped sacrificial layer of polygermanium, further comprises the step of heating below about 650° C.

17. The method of claim 8, wherein an interface between a p+ diffusion and an n+ diffusion lies in the same plane and directly below an interface between a p+ junction and an n+ junction after the step of annealing the substrate.

18. A method for forming a silicon semiconductor device comprising the steps of:
   providing a substrate;
   forming a first doped sacrificial layer of germanium oxide on the substrate wherein the first dopant is one of a p+ and n+ dopant;
   defining a first and second region in the doped germanium oxide sacrificial layer by forming a protective layer on the first region;
   removing the second region in the doped germanium oxide sacrificial layer and forming an exposed substrate under the second region;
   removing the protective layer on the first region in the doped germanium oxide sacrificial layer;
   doping with one of a second dopant from the group of p+ and n+ dopants into the exposed substrate, wherein the second dopant is different than the first dopant;
   diffusing the first and second dopants into the substrate; and
   removing the doped germanium oxide sacrificial layer.

19. The method of claim 18, wherein the step of defining a first and second region further comprises the steps of forming a photoresist material as the protective layer on the first region.

20. The method of claim 18, wherein the step of, doping with one of a second dopant, further comprises one of gas phase doping and ion implantation.

21. The method of claim 18, wherein the step of, diffusing the first and second dopants into the substrate, further comprises the step of heating the substrate from about 800° C. to about 1200° C.

22. The method of claim 18, wherein the step of removing the doped germanium oxide sacrificial layer further comprises the step of etching with water having a temperature of about 18° C. to about 100° C.

23. A method for forming a silicon semiconductor device comprising the steps of:

provinding a substrate;

forming a polygermanium sacrificial layer on the substrate;

defining a first and second region in the polygermanium sacrificial layer by forming a protective layer on the second region;

doping the first region with one of a p+ and n+ dopant;

removing the protective layer on the second region;

forming a protective layer on the first region in the polygermanium sacrificial layer;

doping second region with a second dopant wherein the second dopant is one of a p+ and n+ dopant, wherein the second dopant is not the same type as the first dopant;

removing the protective layer on the first region in the polygermanium sacrificial layer;

diffusing the first and second dopants into the substrate;

oxidizing the polygermanium sacrificial layer to a germanium oxide sacrificial layer; and removing the germanium oxide sacrificial layer.

24. The method of claim 23, further comprising before the step of forming a protective layer on the first region in the polygermanium sacrificial layer, the step of heating the substrate to between about 800° C. and about 1200° C., thereby providing a head start for the first dopant.

25. The method of claim 23, wherein the step of removing the doped germanium oxide sacrificial layer further comprises the step of etching with water having a temperature of about 18° to about 100° C.

26. The method of claim 1, wherein the step of depositing further comprises using a deposition technique selected from the group consisting of: CVD, PVD, JVD and sputtering.

* * * * *

UNITED STATES PATENT AND TRADEMARK OFFICE
CERTIFICATE OF CORRECTION

PATENT NO. : 6,333,245 B1
DATED : December 25, 2001
INVENTOR(S) : Toshiharu Furukawa et al.

It is certified that error appears in the above-identified patent and that said Letters Patent is hereby corrected as shown below:

Title page,
Item [73], Assignee, delete "NJ" and insert -- NY --;

Column 2,
Line 46, delete "simiconductor" and insert -- semiconductor --;

Column 3,
Line 61, delete ".";
Line 62, after "C" delete ".";

Column 4,
Lines 44 and 64, both occurrences, after "C" delete ".";

Column 5,
Lines 5 and 6, delete ".";
Line 52, both occurrences, after "C" delete ".";
Lines 55 and 56, delete ".";
Line 64, first occurrence, after "C" delete ".";

Column 6,
Line 9, both occurrences, after "C" delete ".";
Line 13, after "C" delete ".";
Line 14, delete ".";
Line 59, first occurrence, after "C" delete ".";

Column 7,
Line 1, delete ".";
Line 28, both occurrences, after "C" delete ".";
Line 33, first occurrence, after "C" delete ".";

Column 8,
Line 6, both occurrences, after "C" delete ".";
Lines 11, 15, 63 and 67, first occurrence, after "C" delete ".";

UNITED STATES PATENT AND TRADEMARK OFFICE
CERTIFICATE OF CORRECTION

PATENT NO.    : 6,333,245 B1
DATED         : December 25, 2001
INVENTOR(S)   : Toshiharu Furukawa et al.

It is certified that error appears in the above-identified patent and that said Letters Patent is hereby corrected as shown below:

<u>Column 10,</u>
Line 9, both occurrences, after "C" delete ".".

Signed and Sealed this

Thirtieth Day of April, 2002

Attest:

JAMES E. ROGAN
*Attesting Officer*     *Director of the United States Patent and Trademark Office*